US007411815B2

(12) United States Patent
Gogl

(10) Patent No.: US 7,411,815 B2
(45) Date of Patent: Aug. 12, 2008

(54) MEMORY WRITE CIRCUIT

(75) Inventor: Dietmar Gogl, Essex Junction, VT (US)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 0 days.

(21) Appl. No.: 11/273,248

(22) Filed: Nov. 14, 2005

(65) Prior Publication Data

US 2007/0109840 A1 May 17, 2007

(51) Int. Cl.
*G11C 11/00* (2006.01)

(52) U.S. Cl. ..................... 365/158; 365/173
(58) Field of Classification Search ............... 365/158, 365/173
See application file for complete search history.

(56) References Cited

U.S. PATENT DOCUMENTS

| 6,421,271 | B1 * | 7/2002 | Gogl et al. ............... 365/158 |
| 6,483,768 | B2 * | 11/2002 | Bohm et al. ............ 365/230.06 |
| 6,944,049 | B2 * | 9/2005 | Hoenigschmid et al. .... 365/158 |
| 6,946,882 | B2 * | 9/2005 | Gogl et al. .................. 327/53 |
| 2002/0024875 | A1 * | 2/2002 | Bohm et al. ............ 365/230.06 |
| 2002/0110028 | A1 * | 8/2002 | Hassan et al. ............... 365/200 |
| 2003/0112657 | A1 * | 6/2003 | Lu et al. ..................... 365/158 |
| 2005/0128795 | A1 | 6/2005 | DeHerrera et al. |
| 2006/0256611 | A1 * | 11/2006 | Bednorz et al. ............ 365/158 |
| 2007/0030719 | A1 * | 2/2007 | Hoefler et al. ............... 365/94 |

* cited by examiner

*Primary Examiner*—Michael T Tran
(74) *Attorney, Agent, or Firm*—Slater & Matsil, L.L.P.

(57) ABSTRACT

A design for a memory array that uses bi-directional write currents and that avoids switched ground connections for memory cells, thereby reducing signal loss and noise problems is described. Positive and negative current sources are provided to supply the bi-directional current that is used to write to a memory cell. These current sources may be selectively connected to bit lines that are electrically connected to the memory cells. Applying a positive current, from the positive current source, through a memory cell writes a "1", and applying a negative current, from the negative current source, through a memory cell writes a "0". Use of both a positive and a negative current source enables writing to the memory cells without relying on a switched ground connection to provide bi-directional current. This permits a ground connection of each memory cell to be connected to a fixed ground. An example in which this design is used with a spin injection magneto-resistive random access memory (MRAM) device is shown.

23 Claims, 2 Drawing Sheets

MEMORY WRITE CIRCUIT

TECHNICAL FIELD

The present invention relates generally to memory devices, and in one embodiment to the design of a write circuit for a memory device.

BACKGROUND

One emerging technology for non-volatile memory is magneto-resistive random access memory (MRAM). A common form of MRAM is based on the tunnelling magneto-resistance (TMR) effect, in which each memory cell comprises a magnetic tunnel junction (MTJ). Such an MTJ may be formed from two ferromagnetic metal layers, with an insulating layer placed between the metal layers. When a voltage is applied between the metal layers, a tunnel current flows. The tunnel resistance varies based on the relative directions of magnetization of the metal layers. The tunnel resistance is small when the directions of magnetization are parallel (typically representing a "0"), and large (approximately 10%-20% higher, at room temperature) when the directions of magnetization are anti-parallel (typically representing a "1").

The metal layers in a typical MRAM MTJ include a "fixed" layer, in which the direction of the magnetization is fixed, and a "free" layer, in which the direction of the magnetization can be switched by application of currents. These currents are typically applied through conductive write lines referred to as bit lines and word lines, which are disposed so that the bit lines are orthogonal to the word lines. In an MRAM array, an MTJ memory cell is located at each intersection of a bit line with a word line.

In a typical MTJ cell, to switch the direction of magnetization of the free layer, of a particular cell, currents are applied through the bit line and the word line that intersect at that cell. The direction of these currents determines the direction in which the magnetization of the free layer will be set. The combined magnitude of the currents through the word and bit lines must be sufficient to generate a magnetic field at their intersection that is strong enough to switch the direction of magnetization of the free layer.

A more recent type of MRAM cell is a spin-injection MRAM. In a spin-injection MRAM, the free layer is not switched via application of a magnetic field generated by the bit lines and word lines. Instead, a write current is applied directly through the MTJ to switch the free layer. The direction of the write current through the MTJ determines whether the MTJ is switched into a "0" state or a "1" state. A select transistor connected in series with the MTJ may be used to select a particular cell for a write operation.

One problem with MRAM devices is that the signals provided by MTJs on reading are small relative to the signals provided by other non-volatile memory technologies. This small signal makes reliable readout at high speeds difficult, and generally requires that the sense amplifier that is used to read MRAM memory use as much of the cell signal as possible. Thus, reduction of signal losses in the sensing path of the memory is of increased importance in MRAM devices.

High-resistive ground connections of memory cells are one common source for signal loss in memory arrays. While providing a low resistive ground connection is relatively straightforward when the memory cells can be permanently tied to ground, it can be difficult when the ground connection has to be switched, as is typically the case in spin-injection MRAM, and in other types of memory that use bi-directional current for writing. Because it must be able to force a write current through the MTJ in either direction, typical spin-injection MRAM designs do not have fixed ground connections. This causes noise and signal loss in the sensing path of spin-injection MRAM devices. Similar problems may be encountered in other memory devices that use bi-directional current for writing.

What is needed in the art is a design for a memory array that uses bi-directional current for writing, and that reduces signal loss in the sensing path due to switched ground connections.

SUMMARY OF THE INVENTION

In various embodiments, the present invention provides a design for a memory array that uses bi-directional current for writing, and that avoids switched ground connections for memory cells, thereby reducing signal loss and noise problems. In accordance with an embodiment of the invention, this is achieved by connecting a ground connection of each memory cell to a fixed ground, which cannot be switched. To supply the bi-directional current that is needed to write to memory cells, positive and negative current sources are provided. These current sources may be selectively connected to bit lines, that are electrically connected to the memory cells. Applying a positive current, from the positive current source, through a memory cell writes a "1", and applying a negative current, from the negative current source through a memory cell writes a "0". In one embodiment, this technique is applied to a spin injection magneto-resistive random access memory (MRAM) device, in which each memory cell includes a magnetic tunnel junction (MTJ).

In accordance with one embodiment, a select transistor is connected in series with the MTJ in each memory cell. The word lines are connected to the gates of the select transistors, and the bit lines are connected to MTJs so that current applied to a bit line will flow through the MTJ of a memory cell if the select transistor for that memory cell is activated.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Figure 1:
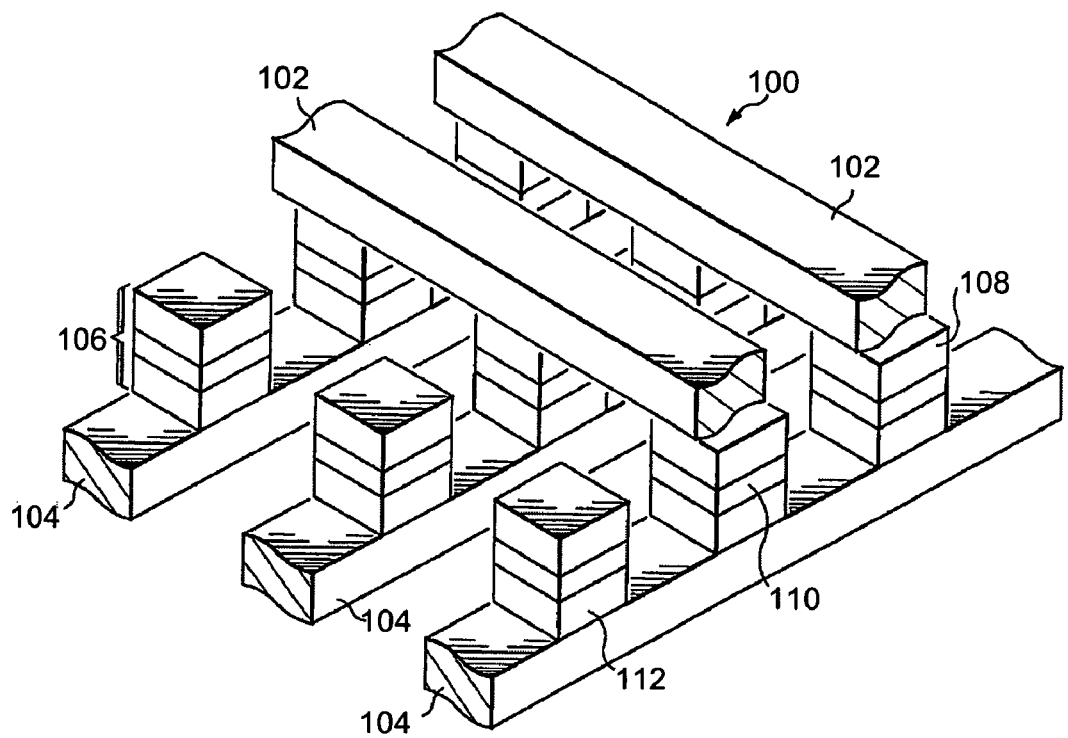
FIG. 1 shows a perspective view of a prior art MRAM array.

FIG. 1 shows a perspective view of a typical prior art MRAM array 100 having bit lines 102 disposed in an orthogonal direction to word lines 104 in adjacent metallization layers. Magnetic memory stacks 106 are electrically coupled to the bit lines 102 and word lines 104 (collectively, write lines), and are positioned between the bit lines 102 and word lines 104 at locations where a bit line 102 crosses a word line 104. The magnetic memory stacks 106 are preferably magnetic tunnel junctions (MTJs), comprising multiple layers, including a free layer 108, a tunnel layer 110, and a fixed layer 112. The free layer 108 and fixed layer 112 preferably comprise a plurality of magnetic metal layers (not shown). These magnetic metal layers may, for example, comprise eight to twelve layers of materials such as PtMn, CoFe, Ru, and NiFe. The tunnel layer 110 comprises a dielectric, such as $Al_2O_3$.

The fixed layer 112 is preferably magnetized in a fixed direction, while the direction of magnetization of the free layer 108 may be switched, changing the resistance of the magnetic memory stack 106. One bit of digital information may be stored in a magnetic memory stack 106 by running a current in the appropriate direction through the bit line 102 and the word line 104 that intersect at the magnetic memory stack 106, creating a sufficient magnetic field to set the direction of magnetization of the free layer 108. Information may be read from a magnetic memory stack 106 by applying a voltage across the magnetic memory stack, and measuring the resistance. If the direction of magnetization of the free layer 108 is parallel to the direction of magnetization of the fixed layer 112, then the measured resistance will be low, representing a value of "0" for the bit. If the direction of magnetization of the free layer 108 is anti-parallel to the direction of magnetization of the fixed layer 112, then the resistance will be high, representing a value of "1".

It will be understood that the view shown in FIG. 1 is simplified, and that actual MRAM devices may include additional components. For example, in some MRAM designs, a transistor is coupled to each magnetic memory stack 106, for isolation. It will further be recognized that the view shown in FIG. 1 represents only a small portion of an actual MRAM device. Depending on the organization and memory capacity of the device, there may be hundreds or thousands of bit lines and word lines in a memory array. For example, a 1 Mb MRAM device (i.e., an MRAM device storing approximately one million bits of data) may include two arrays, each of which has 1024 word lines and 512 bit lines. Additionally, in some MRAM devices, there may be multiple layers of magnetic memory stacks, in which layers may share bit lines or word lines.

Figure 2:
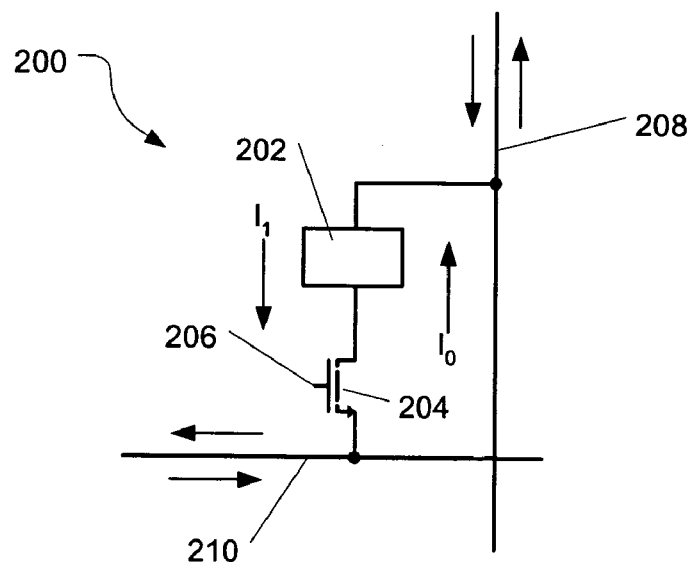
FIG. 2 shows the design of a memory cell of a prior art spin-injection MRAM device.

FIG. 2 shows one cell of a more recent type of MRAM called spin-injection MRAM. A spin-injection MRAM cell 200 includes an MTJ 202, which is connected in series with a select transistor 204. A word line (not shown) is used to select the cell by controlling the select line 206 of the transistor 204. When writing, current is forced through the MTJ 202 through a bit line 208, which is connected to the MTJ 202 and a common line 210, which is connected to the transistor 204. The value written in the MTJ 202 depends on the direction of the current. Current $I_0$, which is forced through the MTJ 202 in a first direction, causes the MTJ 202 to be switched into the "0" state. Current $I_1$, which is forced through the MTJ 202 in the opposite direction, causes the MTJ 202 to be switched into the "1" state. When reading, the same selection mechanism is employed, and the bit line 208 and common line 210 are used to sense the resistance of the MTJ 202.

There are several advantages to the use of a spin-injection MRAM, such as is shown in FIG. 2. First, because magnetic fields generated by current flowing through the bit lines and word lines are not used for writing, the currents may be lower than in some designs, and adjacent cells will not be inadvertently switched by such fields. Additionally, spin-injection MRAM cells may be more compact than other MRAM designs, permitting higher density MRAM arrays to be manufactured.

One problem with most current MRAM memory devices, is that the signal provided by the MTJs in the memory is small compared to the signal provided by other non-volatile memory technologies, such as ROM, EEPROM, or Flash-EEPROM. This problem is intensified by the relatively small cell size of spin-injection MRAM. As a result, signal loss and noise may render the small signal from the MTJs very difficult to read, unless measures are taken to reduce such effects.

One common source of signal loss in memory arrays is high-resistive ground connections of the memory cells in the array. Such high-resistive ground connections can result in problems when comparing the signal of a memory cell to that of a reference cell, which is typically done during a read operation. Additionally, high-resistive ground connections to memory cells can result in noise problems, which make reading the values stored in the memory cells more difficult.

In many memory designs, problems with high-resistive ground connections can be avoided by permanently tying the ground connection of the memory cells to ground. However, spin-injection MRAM, such as is shown in FIG. 2, as well as some other types of memory, such as conductive bridging RAM (CBRAM), present particular difficulties in this regard due to the bi-directional write currents that are used to write data to the memory cells. Due to the bi-directional current flow, the ground connections of the memory cells are often not permanently tied to ground. Instead, numerous memory cells are connected to a common line that is switched at one end. The switch may connect the common line to ground, or to a current source to provide the bi-directional write current used in such memory devices. Because the ground connections of the memory cells have varying distances from the ground switch, there will be varying voltage drops and noise problems along the line.

Figure 3:
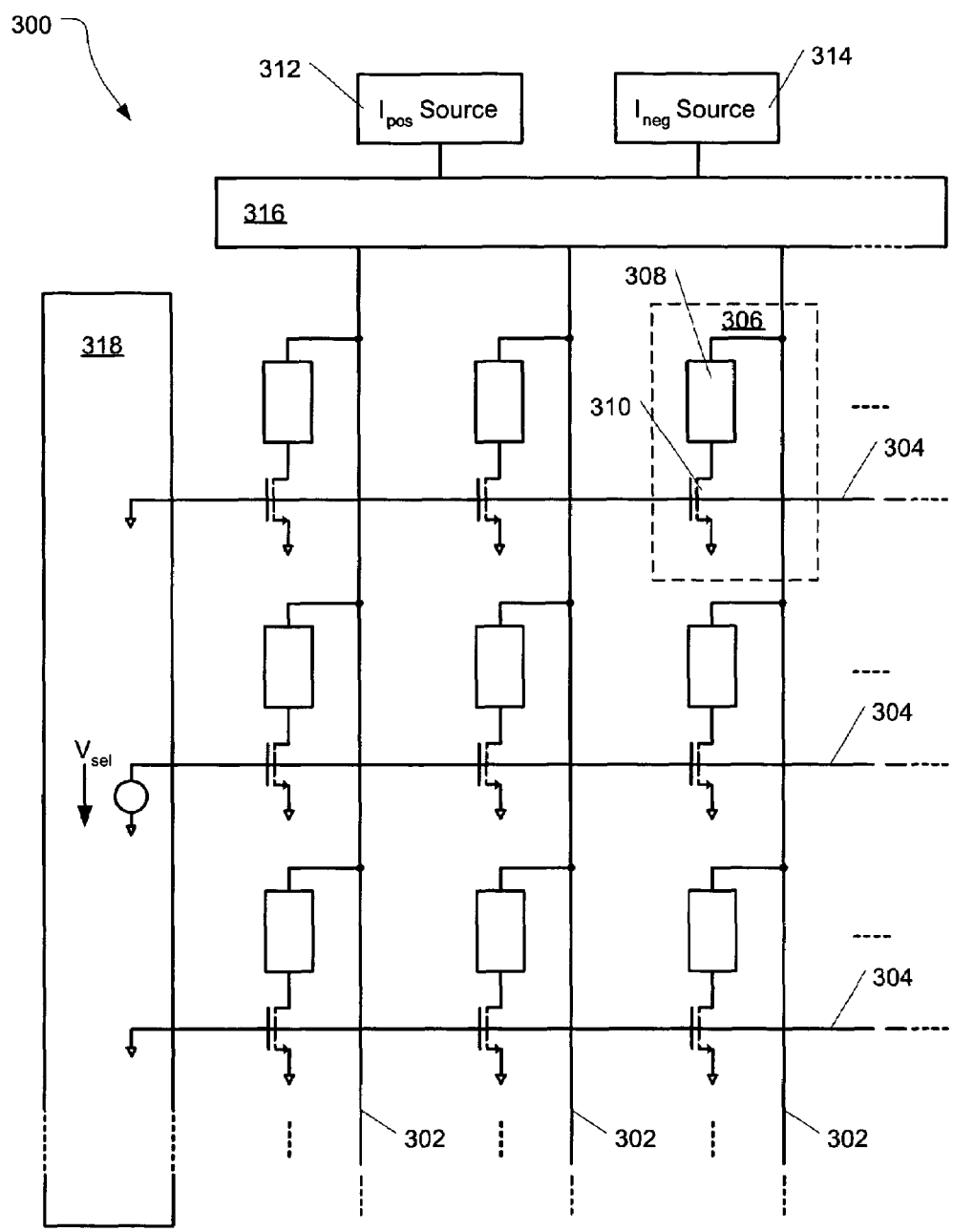
FIG. 3 shows the design of a spin-injection MRAM array in accordance with an embodiment of the present invention.

As shown in FIG. 3, in accordance with the invention, problems associated with cell ground switching in memories that use bi-directional write currents, such as spin-injection MRAM, may be avoided. In the embodiment shown in FIG. 3, a write circuit for a spin injection MRAM is shown for the purpose of illustrating the present invention. It should be understood that a substantially similar design may be employed to avoid problems with cell ground switching in other types of memory that use bi-directional write currents.

In the embodiment of the invention shown in FIG. 3, a spin-injection MRAM array 300 includes a plurality of bit lines 302 and a plurality of word lines 304. Memory cells 306 are located at intersections of the bit lines 302 and word lines 304.

Each of the memory cells 306 includes a magnetic tunnel junction (MTJ) 308 and a select transistor 310, which is coupled in series with the MTJ 308. The word lines 304 are electrically coupled to the gates of the select transistors 310, so that any particular select transistor 310 is activated when a voltage $V_{sel}$ is applied on the word line 304 to which that select transistor 310 is coupled, and is deactivated when the word line 304 is grounded. The bit lines 302 are electrically coupled to one end of the MTJs 308, so that current that is applied on a bit line 302 will flow through an MTJ 308 if the select transistor 310 that is connected to that MTJ 308 is activated. The ground connection of each of the select transistors 310 (and hence, memory cells 306) is fixed at ground, and cannot be switched.

The MRAM array 300 also includes a positive current source 312 and a negative current source 314. Applying a positive current, from the positive current source 312, will cause a "1" to be written to a selected memory cell 306. Similarly, applying a negative current, from the negative current source 314, will cause a "0" to be written to a selected memory cell 306.

In one embodiment, the positive current source 312 and the negative current source 314 comprise standard charge pump circuits, which supply the required currents. Because the write current (either positive or negative) for spin-injection MRAM is generally in the range of approximately 10 μA to 200 μA, known charge pump circuits can be used to provide the positive and negative current. Alternatively, in some embodiments, the positive current source 312 can be derived from the chip supply voltage of the chip on which the MRAM array 300 is located, so a charge pump is used only for the negative current.

In some embodiments, particularly those in which the write current is relatively low, known voltage boost circuits may be used instead of charge pump circuits to provide either the negative current (i.e., where the positive current is derived from the chip supply voltage), or both the positive and negative currents. Additionally, it should be noted that in some embodiments, use of a negative voltage (e.g., for the negative current source 314) may require use of a known process technology similar to that used with DRAM or Flash-EEPROM, in which the silicon areas connected to the negative voltage are separated from the substrate by additional well implants.

The MRAM array 300 further includes a column selector 316, and a row decoder 318. The column selector 316 connects either the positive current source 312 or the negative current source 314 to a selected one of the bit lines 302, depending on which bit in a particular word is being written. The row decoder 318 decodes the word address, and applies a voltage $V_{sel}$ to a selected one of the word lines 304, depending on which word in the MRAM array 300 is to be written. All of the other word lines 304 are deselected by connecting them to ground.

To perform a write operation of a value of "1" or "0" to a selected bit of a selected word, the MRAM array 300 uses the row decoder 318 to connect a word line 304 that corresponds to the selected word to a voltage $V_{sel}$, thereby activating the select transistors 310 of memory cells 306 that are connected to that word line 304. If a "1" is being written, then the column selector 316 connects the positive current source 312 to a bit line 302 that corresponds to the selected bit. Otherwise, if a "0" is being written, the column selector 316 connects the negative current source 314 to the bit line 302 that corresponds to the selected bit. This forces current through the MTJ 308 of the memory cell 306, that is at the intersection of the word line 304 and bit line 302, that correspond to the selected word and bit to be written. The direction of the current depends on the current source that is used, so that the correct value is written to the MTJ 308.

Advantageously, use of the positive current source 312 and negative current source 314 permit current to be applied through the MTJ 308 in either direction without the ground connection of a memory cell 306 needing to be switched. In the embodiment described with reference to FIG. 3, all of the ground connections of the memory cells 306 of MRAM array 300 are fixed at ground, and cannot be switched. This reduces noise problems, which, as discussed above, can cause difficulties when reading the values stored in the memory cells 306. Although using a positive current source 312 and a negative current source 314 takes up some space on the chip that includes the MRAM array 300, use of conventional charge pump circuits or voltage boost circuits to supply the currents will take relatively little space. Additionally, as noted above, in some embodiments, the positive current is supplied by the chip supply voltage, so only the negative current source 314 will require substantial additional space on the chip.

It will be understood by those skilled in the relevant arts that the design shown in FIG. 3 may be used with other types of memory devices that use bi-directional current for writing. For example, conductive bridging RAM (CBRAM) is a recent non-volatile memory technology based on the formation of conductive bridges within a solid electrolyte placed between two metal lines. When current is passed through a CBRAM cell in one direction, material transport of ions in the electrolyte causes a conductive bridge to be formed, causing the cell to have a low resistance. When current is passed through the cell in the opposite direction, the conductive bridge is dispersed (if it was present), or is prevented from forming, causing the cell to have a high resistance. Because the value written to such a CBRAM cell depends on the direction of current through the cell, a configuration substantially similar to that shown in FIG. 3 may be used with a CBRAM array by substituting CBRAM junctions for the MTJs 308. In general, for any memory cell type in which the logical value written to the cell is determined by the direction of current passed through the cell, an arrangement similar to that shown in FIG. 3 may be used to provide a good ground connection for the cells, as well as the bi-directional current that is needed to write the cells.

While the invention has been shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are intended to be embraced.

What is claimed is:

1. A memory device comprising:
    a plurality of word lines;
    a plurality of bit lines; and
    a plurality of memory cells, each memory cell in the plurality of memory cells having a first connection coupled to one of the bitlines, a second connection coupled to one of the word lines and a ground connection;
    wherein each memory cell is electrically connected such that current is capable of flowing through the memory cell between the first connection and the ground connection in a positive direction and in a negative direction;
    wherein each memory cell in the plurality of memory cells is configured so that a first logical value is written to the memory cell by application of a current in the positive direction through the memory cell, and a second logical value is written to the memory cell by application of a current in the negative direction through the memory cell; and
    wherein the ground connection of each memory cell in the plurality of memory cells is electrically connected to a fixed ground.

2. The memory device of claim 1, wherein the fixed ground comprises a low resistive ground connection.

3. The memory device of claim 1, further comprising a positive current source and a negative current source, wherein each of the positive current source and the negative current source are selectively electrically connected to the first connection of a particular memory cell in the plurality of memory cells such that:
    when the positive current source is electrically connected to the first connection of the particular memory cell, current flows through the particular memory cell in the positive direction, thereby writing the first logical value to the particular memory cell; and
    when the negative current source is electrically connected to the first connection of the particular memory cell, current flows through the particular memory cell in the second direction, thereby writing the second logical value to the particular memory cell.

4. The memory device of claim 3, wherein the negative current source comprises a charge pump circuit.

5. The memory device of claim 3, wherein the positive current source is derived from a supply voltage of a chip on which the plurality of memory cells are located.

6. The memory device of claim 3, wherein the positive current source comprises a charge pump circuit.

7. The memory device of claim 3, wherein the positive current source and the negative current source are selectively electrically connected to the first connection of the particular memory cell through a particular one of the bit lines.

8. The memory device of claim 7, further comprising a column selector circuit coupled between the positive current source and the bit lines and between the negative current source and the bit lines.

9. The memory device of claim 1, wherein each memory cell in the plurality of memory cells comprises a select transistor having a gate such that current is prevented from flowing through the memory cell when the gate is deactivated.

10. The memory device of claim 9, wherein the gate is activated by application of an activation voltage, and is deactivated when the gate is coupled to ground.

11. The memory device of claim 10, wherein the gate of the select transistor of each memory cell in the plurality of memory cells is electrically connected to one of the word lines.

12. The memory device of claim 11, further comprising a row decoder circuit that selectively applies the activation voltage to a particular one of the word lines and connects all other word lines to ground.

13. The memory device of claim 1, wherein the memory device comprises a spin-injection magneto-resistive random access memory device, and wherein each memory cell in the plurality of memory cells comprises a magnetic tunnel junction.

14. The memory device of claim 1, wherein the memory device comprises a conductive bridging random access memory device.

15. A memory cell comprising:
a first connection and a ground connection, wherein current is capable of flowing through the memory cell between the first connection and the ground connection in a positive and a negative direction, wherein the ground connection of the memory cell is electrically connected to a fixed ground; and
a junction element, wherein applying a current through the junction element in the positive direction writes a first logical value to the memory cell and applying current through the junction element in the negative direction writes a second logical value to the memory cell.

16. The memory cell of claim 15, wherein the fixed ground comprises a low resistive ground connection.

17. The memory cell of claim 15, further comprising a select transistor coupled in series to the junction element, wherein the select transistor prevents current from flowing through the junction element when the select transistor is deactivated.

18. The memory cell of claim 17, wherein the select transistor is activated by application of an activation voltage to a gate of the select transistor.

19. The memory cell of claim 15, wherein the memory cell comprises a spin-injection magneto-resistive random access memory cell, and wherein the junction element comprises a magnetic tunnel junction.

20. The memory cell of claim 15, wherein the memory cell comprises a conductive bridging random access memory device (CBRAM), and wherein the junction element comprises a CBRAM junction.

21. A method of operating a memory device, the method comprising:
providing a memory cell that includes a first connection and a ground connection;
flowing a current through the memory cell between the first connection and the ground connection, wherein the memory cell is electrically connected such that the current is capable of flowing through the memory cell in a positive direction and in a negative direction and wherein a first logical value or a second logical value is written to the memory cell depending on whether the current is a positive or a negative current through the memory cell; and
electrically connecting the ground connection of the memory cell to a fixed ground.

22. The method of claim 21, wherein flowing a current through the memory cell comprises providing a positive current source that derives the positive current from a supply voltage of the memory device.

23. The method of claim 21, wherein the memory device comprises a magneto-resistive random access memory device and the memory cell comprises a magnetic tunnel junction, wherein the method further comprises:
applying the positive current through the magnetic tunnel junction to write the first logical value to the memory cell; and
applying the negative current through the magnetic tunnel junction to write the second logical value to the memory cell.

* * * * *